United States Patent
Cho et al.

(10) Patent No.: US 7,009,435 B2
(45) Date of Patent: Mar. 7, 2006

(54) OUTPUT BUFFER WITH CONTROLLED SLEW RATE FOR DRIVING A RANGE OF CAPACITIVE LOADS

(75) Inventors: Jun Ho Cho, Singapore (SG); Hong Sair Lim, Singapore (SG)

(73) Assignee: Nano Silicon Pte Ltd., Singapore (SG)

( * ) Notice: Subject to any disclaimer, the term of this patent is extended or adjusted under 35 U.S.C. 154(b) by 0 days.

(21) Appl. No.: 10/796,386

(22) Filed: Mar. 9, 2004

(65) Prior Publication Data

US 2005/0200392 A1   Sep. 15, 2005

(51) Int. Cl.
*H03K 5/12* (2006.01)
(52) U.S. Cl. ........................ 327/170; 326/87
(58) Field of Classification Search ............. 326/85, 326/87, 91; 327/112, 170
See application file for complete search history.

(56) References Cited

U.S. PATENT DOCUMENTS

| | | | |
|---|---|---|---|
| 4,604,731 A * | 8/1986 | Konishi ............... | 365/189.05 |
| 5,808,478 A | 9/1998 | Andresen .............. | 326/31 |
| 5,821,783 A * | 10/1998 | Torimaru et al. ..... | 327/108 |
| 5,854,560 A * | 12/1998 | Chow ..................... | 326/27 |
| 5,926,651 A | 7/1999 | Johnston et al. ...... | 395/872 |
| 6,265,913 B1 | 7/2001 | Lee et al. .............. | 327/108 |
| 6,380,770 B1 * | 4/2002 | Pasqualini ............ | 327/112 |
| 6,583,644 B1 | 6/2003 | Shin ...................... | 326/26 |

OTHER PUBLICATIONS

R. Senthinathan et al., "Application Specific CMOS Output Driver Circuit Design Techniques to Reduce Simultaneous Switching Noise," IEEE Journal of Solid-State Circuits, vol. 28, No. 12, Dec. 1993, pp. 1383-1388.

* cited by examiner

*Primary Examiner*—Jeffrey Zweizig
(74) *Attorney, Agent, or Firm*—George D. Saile; Stephen B. Ackerman (57) ABSTRACT

Output buffer slew rate variation over variations in load capacitance is minimized by dividing output voltage transitions into distinct time and output current segments. During the first time segment, the first drive stage with the smallest current is employed. After subsequent delays, additional drive stages are employed and the load current is sequentially increased. Each drive stage employs a specifically sized feedback device which, depending upon its dimensions will provide either parasitic capacitance to slow transitions or positive feedback to speed up transitions. The first stages are sized to incorporate parasitic capacitance, resulting in little change in the settling time of small capacitance loads over prior art output buffers. Latter stages use positive feedback to quicken the transition time which dramatically improves the settling time for larger load capacitances over prior art output buffers.

28 Claims, 9 Drawing Sheets

OUTPUT BUFFER WITH CONTROLLED SLEW RATE FOR DRIVING A RANGE OF CAPACITIVE LOADS

BACKGROUND OF THE INVENTION (1) Field of the Invention

The invention generally relates to semiconductor integrated circuit devices and, more particularly, to an output buffer used in integrated circuit (IC) device.

(2) Description of Prior Art

Figure 1:
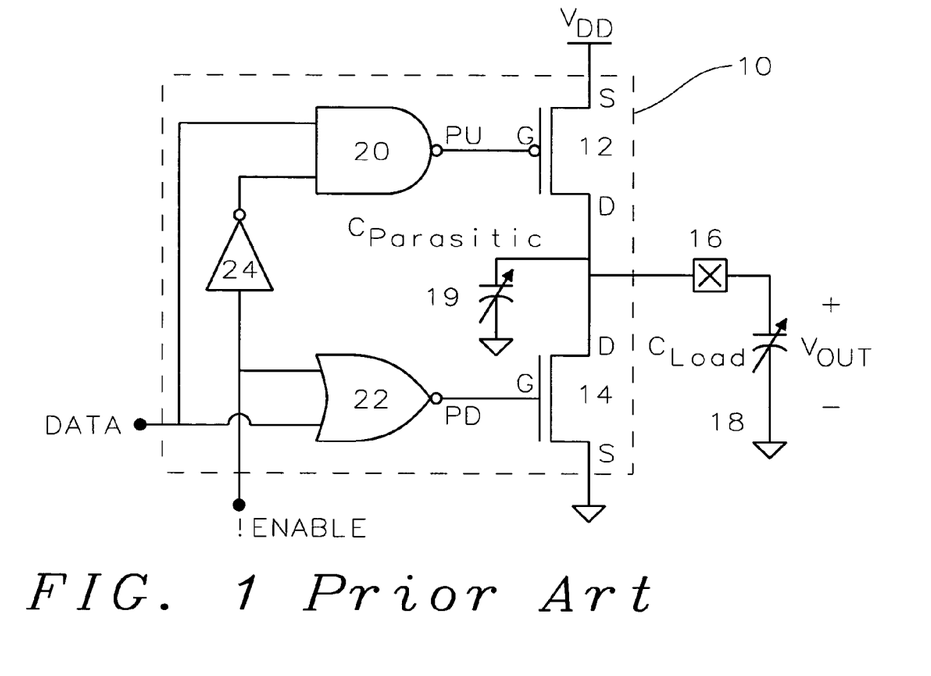
FIG. 1 schematically illustrating a prior art output buffer.

Output buffer or driver circuits are employed in integrated circuit devices as a means of transferring signals within a device to the input of another device. FIG. 1 shows a conventional output buffer 10, comprised of a pull-up PMOS transistor 12 and a pull-down NMOS transistor 14. PMOS transistor 12 has a source terminal (S) connected to the supply voltage $V_{DD}$ and a drain terminal (D) connected to both the output pin 16 and the drain terminal (D) of NMOS transistor 14. The source terminal of NMOS transistor 14 is connected to ground (GND). The output pin 16 is typically connected to the inputs of one or more CMOS device inputs. These inputs are modeled as a variable load capacitance 18 and the voltage across capacitance load 18 is depicted as $V_{OUT}$. In addition, there is a parasitic capacitance 19 at the output terminal 16 associated with PMOS transistor 12 and NMOS transistor 14. The gate terminal (G) of the PMOS transistor 12 is connected to the output of a NAND gate 20. The gate terminal (G) of the NMOS transistor 14 is connected to the output of a NOR gate 22. A DATA signal is applied to one input of the NAND gate 20 and to one input of the NOR gate 22. An active low !ENABLE signal is applied to a second input of the NOR gate 22 and to the input of an INVERTER 24. The output of the INVERTER 24 is applied to a second input of the NAND gate 20.

A low logic level on the gate terminal (G) of PMOS transistor 12 will cause it to conduct from source (S) to drain (D). A high logic level on the gate terminal (G) of PMOS transistor 12 will result in a high resistance from source (S) to drain (D). A high logic level on the gate terminal (G) of NMOS transistor 14 will cause it to conduct from drain (D) to source (S) and a low logic level on the gate terminal (G) of NMOS transistor 14 will result in a high resistance from drain (D) to source (S). When a high level logic signal (approximately equal to $V_{DD}$) is applied to the active-low !ENABLE input, the output of the INVERTER 24 is low (approximately equal to 0V). Under these conditions, the output of the NAND 20 (signal PU) is high and the output of the NOR 22 (signal PD) is low. This results in both PMOS and NMOS transistors 12 and 14, respectively, being turned off (high resistance from source to drain). This is known as the tri-state condition and is used to disconnect a device from the circuit thereby allowing another device to drive the output. Notice that in the tri-state condition, the DATA signal has no effect on the logic level of the output pin 16.

Figure 2A:
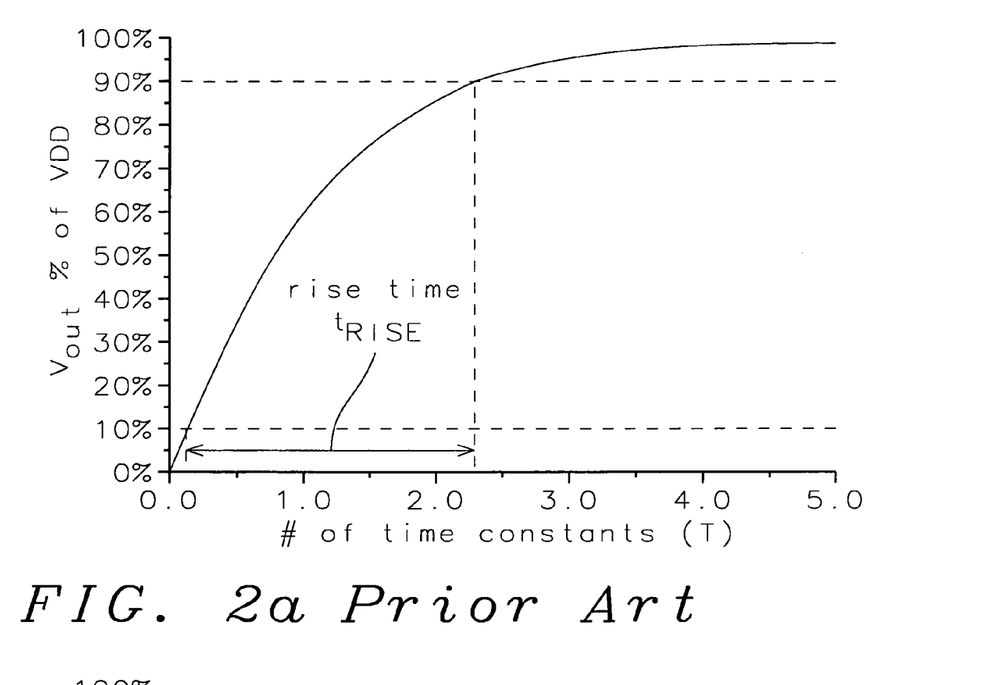
FIG. 2a illustrating a typical output buffer voltage rise waveform for the prior art buffer of FIG. 1.
Figure 2B:
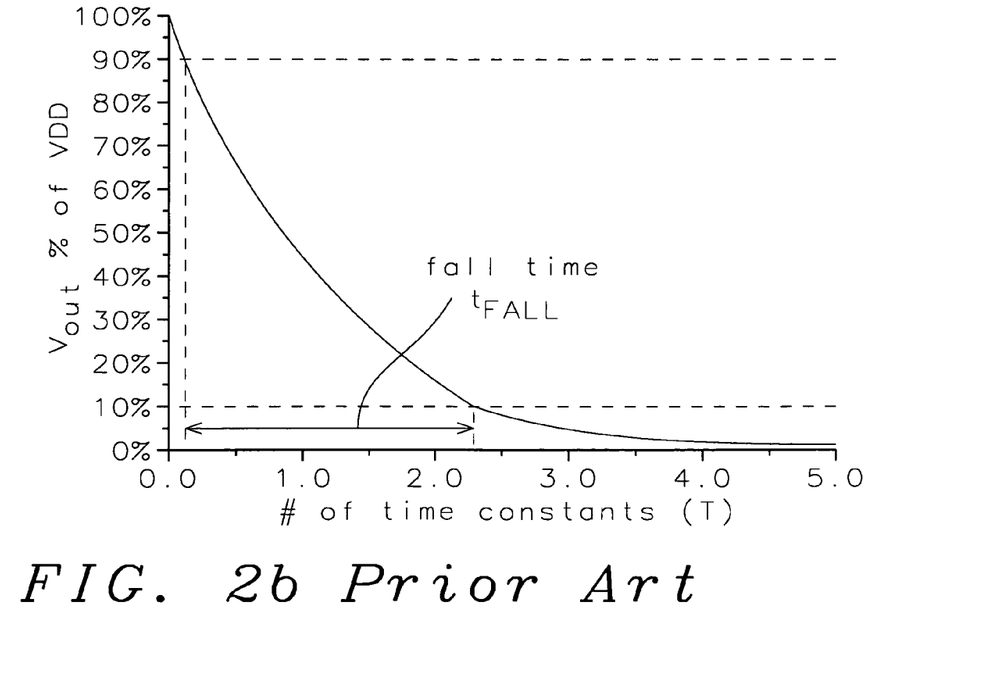
FIG. 2b illustrating a typical output buffer voltage fall waveform for the prior art buffer of FIG. 1.

When a low level logic signal is applied to the active-low !ENABLE input, the output of the INVERTER 24 is high. With a high level logic DATA signal applied while the !ENABLE input is held low, the output of both NAND 20 (PU) and NOR 22 (PD) are low. PMOS transistor 12 is turned on (low source to drain resistance) and NMOS transistor 14 is turned off (high source to drain resistance). Load capacitance 18 and parasitic capacitance 19 will charge through the source to drain resistance of PMOS transistor 12 as shown in FIG. 2a. With a low level logic DATA signal applied while the !ENABLE input is held low, the output of both NAND 20 (PU) and NOR 22 (PD) are high. PMOS transistor 12 is turned off (high source to drain resistance) and NMOS transistor 14 is turned on (low source to drain resistance). Load capacitance 18 and parasitic capacitance 19 will discharge through the source to drain resistance of NMOS transistor 14 as shown in FIG. 2b. The time constant ($\tau$) for charging and discharging of the load capacitance 18 and parasitic capacitance 19 is the product of the source to drain resistance ($R_{SD}$) of the respective conducting device and the sum of the load capacitance 18 and parasitic capacitance 19:

$$\tau = R_{SD} * (C_{LOAD} + C_{PARASITIC}).$$

The output voltage ($V_{OUT}$) while charging load capacitance 18 is given by:

$$V_{OUT\_charge}(t) = V_{DD} * (1 - e^{-t/\tau}) \text{ volts},$$

and the output voltage ($V_{OUT}$) while discharging load capacitance 18 is given by:

$$V_{OUT\_discharge}(t) = V_{DD} e^{-t/\tau} \text{ volts}.$$

Rise time is typically defined as the time it takes a signal to switch from 10% to 90% of the signal change. Thus, the rise time ($t_{RISE}$) of this output buffer 10 would be the time it takes to change from $0.1*V_{DD}$ to $0.9*V_{DD}$. The output buffer 10 fall time ($t_{FALL}$) would be measured as the time it takes to change from $0.9*V_{DD}$ to $0.1*V_{DD}$. It can be shown that:

$$t_{RISE} \text{ or } t_{FALL} = \ln(9)*\tau \approx 2.2 \quad *\tau = 2.2*R_{SD}*(C_{LOAD}+C_{PARASITIC}).$$

As load capacitance 18 increases, the time constant ($\tau$) increases, thereby increasing the rise and fall times ($t_{RISE}$ and $t_{FALL}$, respectively). $R_{SD}$ may be decreased to shorten rise and fall times; this is accomplished by increasing the ratio of channel width to channel length in the PMOS and NMOS transistors, 12 and 14. This, however, adds additional parasitic capacitance 19 thereby preventing ideal improvements in transition times.

Figure 3:
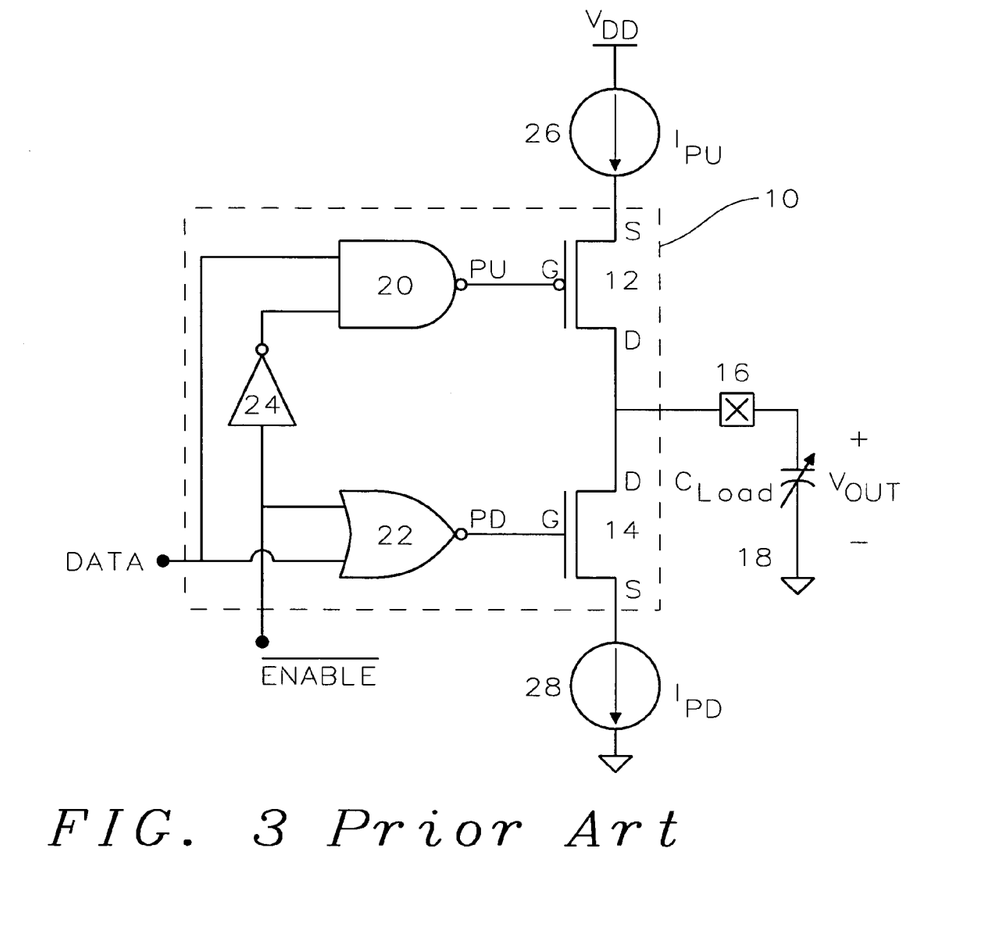
FIG. 3 schematically illustrating a prior art output buffer with improvements over the prior art output buffer of FIG. 1.

An improvement over the conventional output device of FIG. 1 is shown in FIG. 3. The output buffer 10 is connected as shown in FIG. 1, however, a pull-up current source 26 is added between the supply voltage $V_{DD}$ and the source (S) of the PMOS transistor 12. Similarly, a pull-down current source 28 is connected between the source (S) of the NMOS transistor 14 and the circuit common. Constant current sources are typically current mirrors understood by those skilled in the art.

Referring now to FIG. 3, with the active-low !ENABLE signal high, the output PMOS and NMOS transistors 12 and 14 will be off and the output will be in a tri-state condition. With the !ENABLE low and the DATA signal high, PMOS transistor 12 is turned on and NMOS transistor 14 is turned off. A constant current, $I_{PU}$, supplied by pull-up current source 26 will charge the load capacitance 18 to the supply voltage $V_{DD}$. Similarly, when a logic low level DATA signal is applied while !ENABLE is low turns on NMOS transistor 14 and turns off PMOS transistor 12. A constant current, $I_{PD}$, supplied by pull-down current source 28 discharges the load capacitance 18. The current ($I_C$) through the load capacitance 18 current is given by the equation:

$$I_{C_{LOAD}} = C_{Load} * dV_{C_{LOAD}}/dt = C_{Load} * dV_{OUT}/dt.$$

Figure 4A:
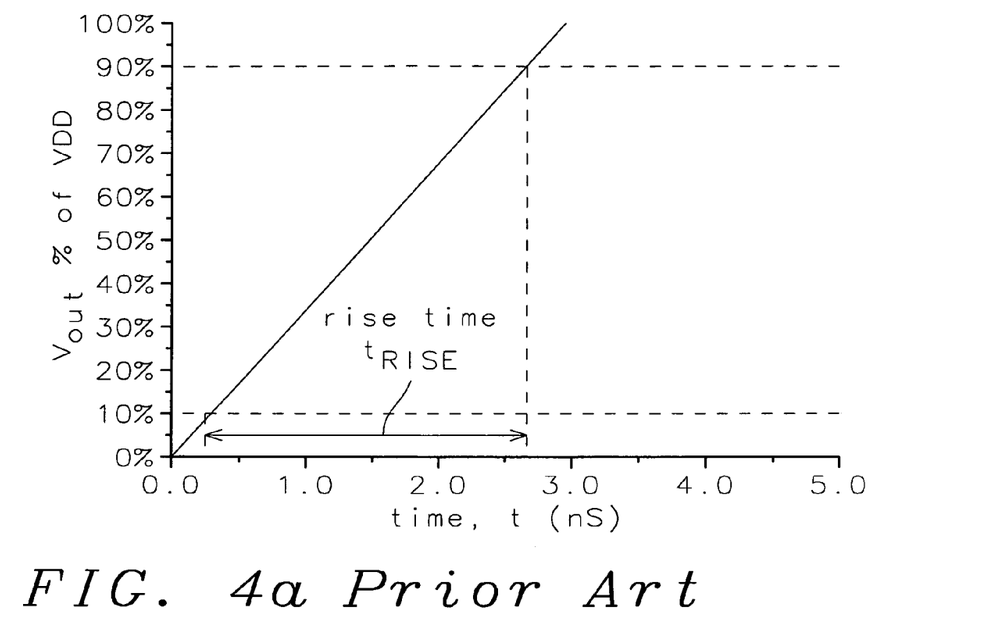
FIG. 4a illustrating a typical output buffer voltage rise waveform for the prior art buffer of FIG. 3.
Figure 4B:
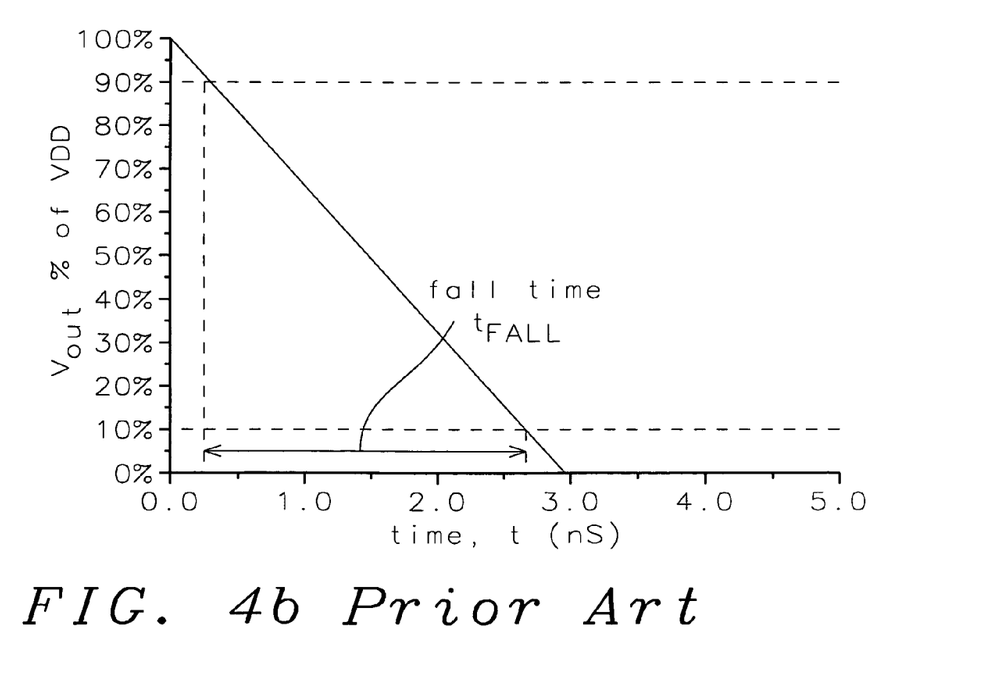
FIG. 4b illustrating a typical output buffer voltage fall waveform for the prior art buffer of FIG. 3.

Since, in either charge or discharge conditions, the current ($I_C$) and load capacitance 18 are constant (either $I_{PU}$ or $I_{PD}$), the change of the output voltage, $V_{OUT}$, with respect to time ($dV_{OUT}/dt$) must be constant. The output voltage ($V_{OUT}$) rise and fall waveforms are shown in FIGS. 4a and 4b, respectively. The change of the output voltage, $V_{OUT}$, with respect to time ($dV_{OUT}/dt$) is the slew rate (SR). Thus the rising and falling slew rates are:

$$SR_{RISE}=I_{PU}/C_{Load},$$

and, $$SR_{FALL}=I_{PD}/C_{Load}.$$

Typically the pull-up and pull-down currents are designed to be equal, so:

$$SR=I_{C_{LOAD}}/C_{Load}.$$

This discussion ignores the effect of parasitic capacitance 19. $I_{PU}$ and $I_{PD}$ are adjusted to compensate for the additional capacitance.

The load capacitance of an output buffer is a function of the number of devices connected to the output. As more devices are connected to the output, the corresponding slew rate decreases and the rise time increases. Manufacture specifications are becoming more stringent; requiring a specific range of both slew rate and load capacitance. For example, consider the specifications below:

0.4 V/ηsec ≤ SR ≤ 1 V/ηsec 15 pF ≤ $C_{LOAD}$ ≤ 40 pF.

The pull-up and pull-down source currents must equal:

$$I=SR*C_{LOAD}.$$

Figure 5:
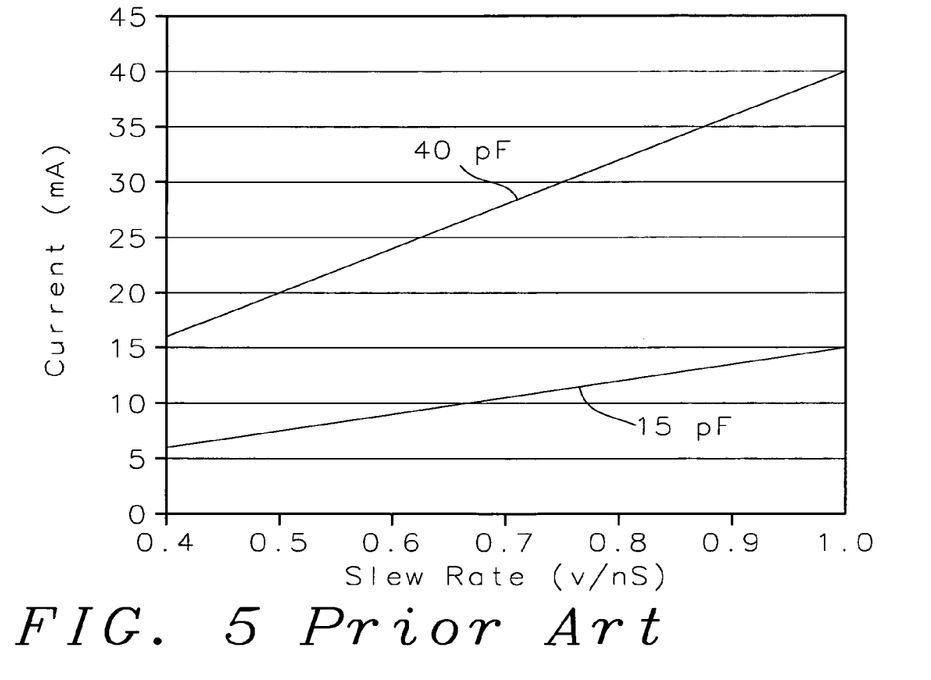
FIG. 5 illustrating in graphical form the required drive current for a desired slew rate using the prior art buffer at both 15 pF and 40 pF load capacitances.

The design challenge with these specifications is illustrated in FIG. 5. For a 15 pF load, the current source must be between 6 mA and 15 mA while the current source must fall between 16 mA and 40 mA for the 40 pF load. Unfortunately, there is no single selection of drive current that will meet the specification at both the minimum and maximum load capacitance.

Other approaches related to improving output buffer characteristics under varying capacitive loads exist. U.S. Pat. No. 5,926,651 to Johnston et al. describes a method where an output buffer slew rate is controlled by providing logic signals to the buffer circuit that switch in or out drive transistors with different current capability. The logic signals are generated by control circuitry that determines the load on the buffer based upon installed components (such as number and size of memory devices). U.S. Pat. No. 5,808,478 to Andresen discloses a method where the output buffer slew rate is varied by comparing the output voltage transition time against a reference. If the output transition time is too long, a counter is incremented and the output buffer drive current is increased. If the output transition time is too short, the counter is decremented thereby reducing the drive current. U.S. Pat. No. 6,265,913 B1 to Lee et al. teaches a method where the output buffer fall time is controlled by comparing the load capacitance against a threshold capacitance. If the load capacitance is larger than the threshold capacitance, a counter is incremented and additional output pull-down transistors are enabled to more quickly discharge the load capacitance. Conversely, if the load capacitance is less than the threshold capacitance, the counter is decremented and fewer pull-down transistors are enabled. U.S. Pat. No. 6,583,644 B2 to Shin describes a method where slew rate is controlled by comparison of input data rise time against bias voltages which vary with processing. Slew rate may be controlled for changing load capacitance; however, this must be accomplished by changing a reference voltage. This requires complicated circuitry or an external device pin. Senthinathan and Prince (*Application specific CMOS output driver circuit design techniques to reduce simultaneous switching noise,* Senthinathan, R. and Prince, J. L., *IEEE Journal of Solid-State Circuits,* Vol. 28, No. 12, December 1993.) describe an output driver where turn on of pull-up and pull-down output transistors are sequenced to control slew rate and avoid switching noise. This driver employs no feedback to detect load capacitance and is for fixed loads only.

SUMMARY OF THE INVENTION

A principal object of the present invention is to provide a method for minimizing slew rate variations over variations in load capacitance.

A second object of the present invention is to provide a circuit for minimizing slew rate variations over variations in load capacitance.

Another object of the present invention is to provide a method for minimizing slew rate variations over variations in load capacitance by varying the output buffer drive current at different times during output state transition.

Another object of the present invention is to provide a circuit for minimizing slew rate variations over variations in load capacitance by varying the output buffer drive current at different times during output state transition.

Another object of the present invention is to provide a method for minimizing slew rate variations over variations in load capacitance by varying the output buffer drive current at different times during output state transition where positive feedback and parasitic capacitance are used to control the slew rate.

Another object of the present invention is to provide a circuit for minimizing slew rate variations over variations in load capacitance by varying the output buffer drive current at different times during output state transition where positive feedback and parasitic capacitance are used to control the slew rate.

A further object of the present invention is to provide a circuit for minimizing slew rate variations over variations in load capacitance by varying the output buffer drive current at different times during output state transition where positive feedback and parasitic capacitance are used to reduce slew rate variations due to differences in manufacturing process, fluctuations in supply voltages and changes in operating temperature.

A still further object of the present invention is to provide a method for minimizing slew rate variations over variations in load capacitance by varying the output buffer drive current at different times during output state transition where positive feedback and parasitic capacitance are used to reduce slew rate variations due to differences in manufacturing process, fluctuations in supply voltages and changes in operating temperature.

These objects are achieved by dividing the output transition into various time and current drive segments. During the first time segment, the smallest drive current is employed. After a delay, the drive current is increased. After each subsequent time delay, additional drive current is added. For larger load capacitances the settling time is dramatically improved by increasing the drive current. In addition, positive feedback from the output back to the gate of each drive transistor will more quickly bring the gate terminal to the proper state. For smaller load capacitances, additional parasitic capacitance in the lower drive stages of the positive feedback mechanism allows a higher drive current to be used to achieve an equal slew rate. Sizing of the positive feedback mechanism provides a way to finely tune the delay time for turn on of the individual drive currents. Thus selection of different component sizes in the positive feedback mechanisms of the different drive stages reduces the slew rate variation for different load capacitances. This also improves the performance with process variations, fluctuating supply voltages and changes in temperature.

BRIEF DESCRIPTION OF THE DRAWINGS

In the accompanying drawings forming a material part of this description, there is shown.

DESCRIPTION OF THE PREFERRED EMBODIMENTS

Figure 6:
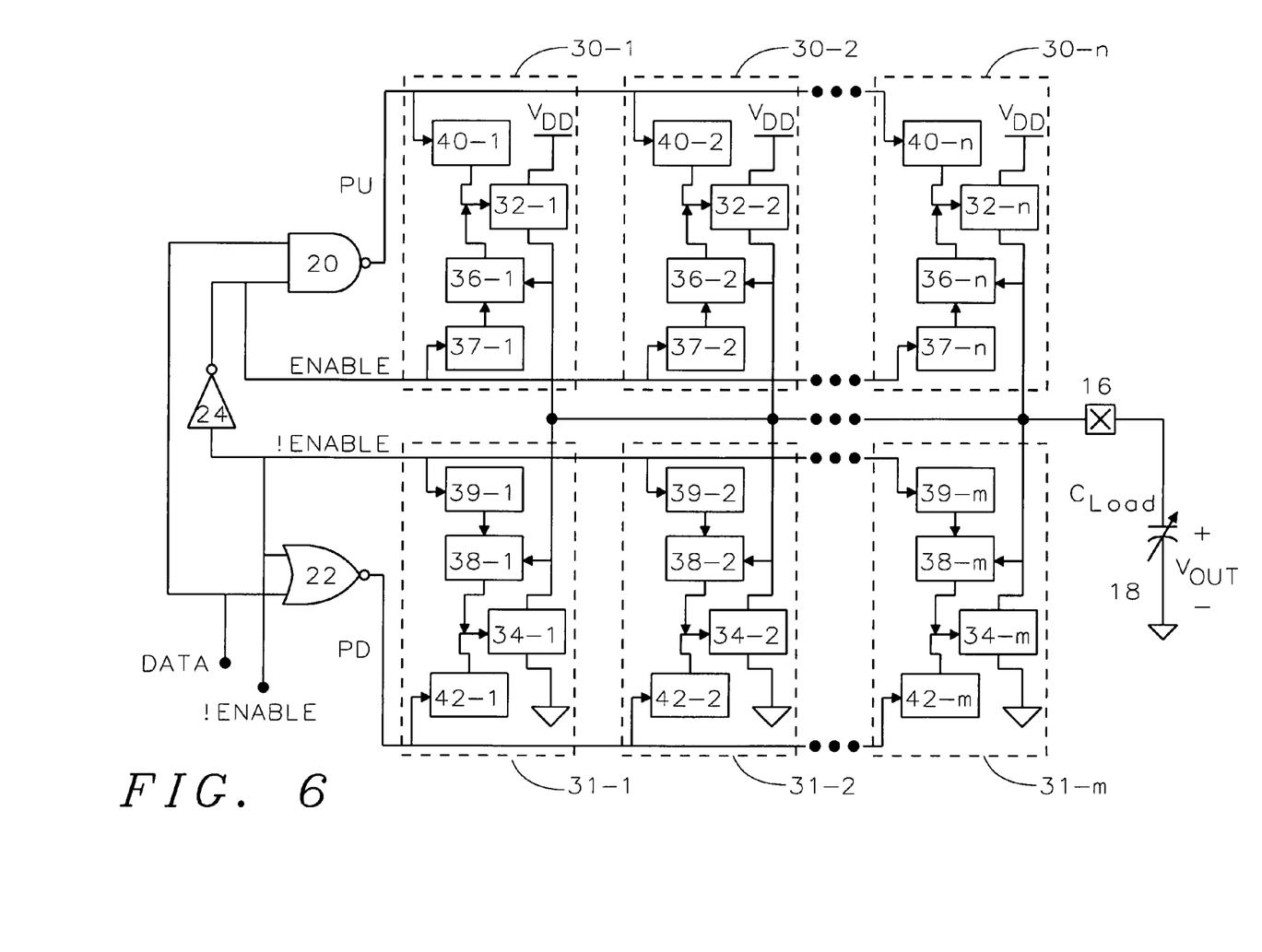
FIG. 6 illustrating a block diagram of the output buffer of the present invention.

Refer now to FIG. 6, depicting in block diagram one embodiment of the output buffer of the present invention. The output buffer is comprised of n pull-up drive stages 30-1 through 30-n and m pull-down drive stages 31-1 through 31-m. The number of pull-up drive stages 30(n) does not necessarily have to equal the number of pull-down stages 31(m). Each pull-up drive stage 30-x is comprised of a pull-up device 32, a feedback device 36, an enabling device 37 and a delay device 40. When pull-up device 32 is activated, it connects the output pin 16 to the supply voltage $V_{DD}$. Feedback device 36 has inputs provided by output pin 16 and the output of the corresponding enabling device 37. The output of the feedback device is connected to the input of the corresponding pull-up device 32. The enabling device 37 has a shared active high ENABLE input. The delay device 40 is connected between a shared PU input signal and the corresponding input to pull-up device 32. When the shared ENABLE is at a logic high level, PU activates the pull-up circuitry to bring the output pin 16 to a high state (approximately $V_{DD}$). Each pull-down drive stage 31-x is comprised of a pull-down device 34, a feedback device 38, an enabling device 39 and a delay device 42. When activated, pull-down device 34 connects the output pin 16 to the circuit common. Feedback device 38 has inputs provided by output pin 16 and the output of the corresponding enabling device 39. The output of the feedback device is connected to the input of the corresponding pull-down device 34. The enabling device 39 has a shared active low !ENABLE input. The delay device 42 is connected between a shared PD input signal and the corresponding input to pull-down device 34. PD activates the pull-down circuitry to drive the output to a low state (0V). Signals PU, PD, ENABLE and !ENABLE could be, for example, provided by the circuit comprised of the NAND 20, NOR 22 and INVERTER 24. The output of NAND 20 provides signal PU and the output of NOR 22 provides signal PD. Signal !ENABLE is provided to the input of INVERTER 24 and signal ENABLE is at the output of INVERTER 24.

Figure 7:
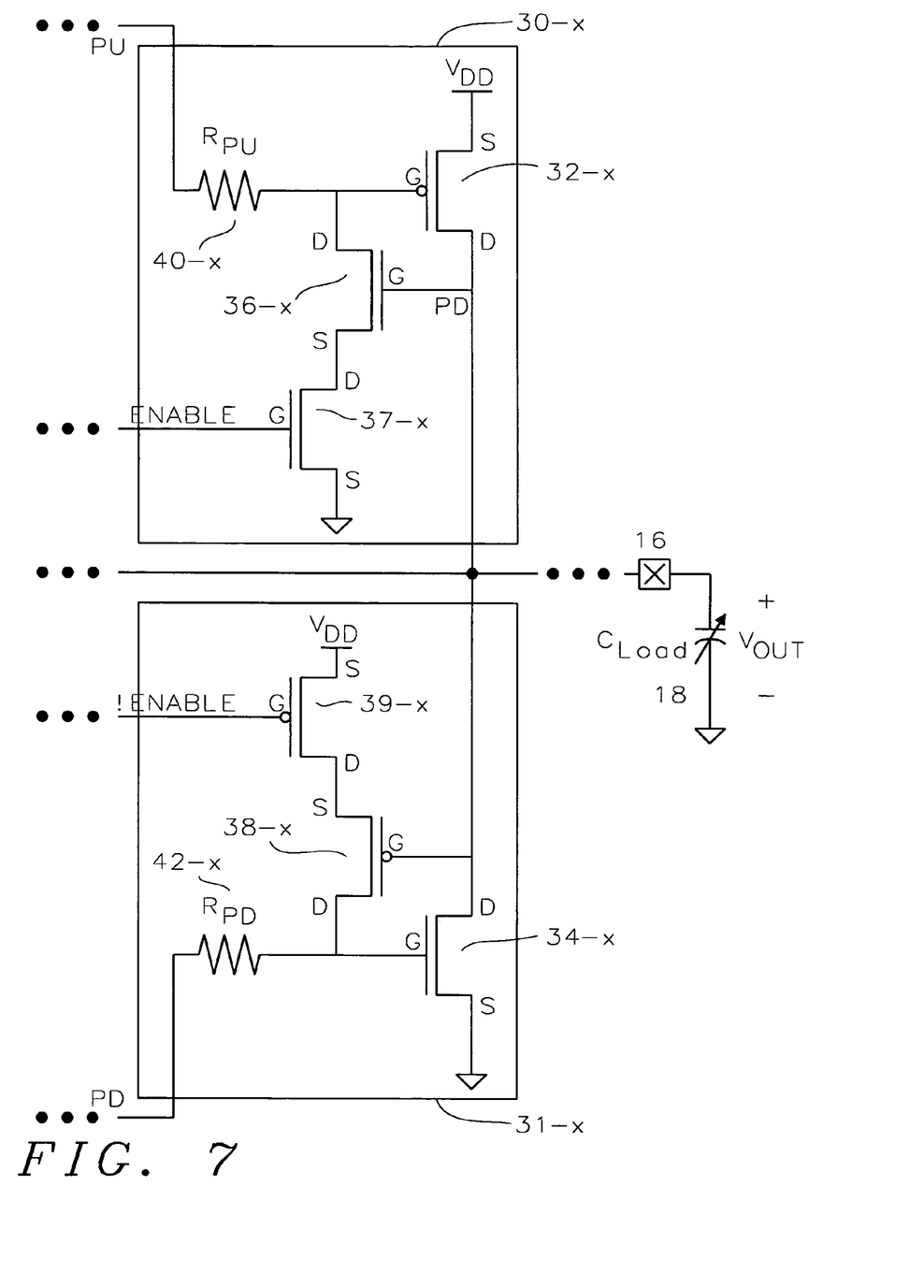
FIG. 7 illustrating schematically one embodiment of the drive stages depicted in FIG. 6 of the output buffer of the present invention.

FIG. 7 shows a circuit embodiment of the pull-up drive stage 30-x and pull-down drive stage 31-x. Devices in this embodiment correspond to specific blocks shown in FIG. 5, so the corresponding designation numbers are used.

The pull-up drive stage 30 is comprised of a PMOS pull-up device 32 sized to provide the proper drive current for that particular stage. The source terminal (S) of PMOS pull-up device 32 is connected to $V_{DD}$ and the drain terminal (D) is connected to the circuit output pin 16 which is typically connected to the capacitive load 18. A pull-up delay resistor ($R_{PU}$) 40 is connected between the signal PU and the gate terminal (G) of PMOS pull-up device 32. An NMOS feedback device 36 is provided with the gate terminal (G) connected to the output terminal 16, and the drain terminal (D) connected to the gate terminal (G) of the PMOS pull-up device 32. An NMOS enable device 37 is provided with the source terminal (S) connected to the circuit common, the gate terminal (G) connected to the active high ENABLE input, and the drain terminal (D) connected to the source terminal (S) of NMOS feedback device 36.

The pull-down drive stage 31 is comprised of an NMOS pull-down device 34 sized to provide the proper drive current for that stage. The drain terminal (D) of NMOS pull-down device 34 is connected to the circuit output pin 16 and the source terminal (S) is connected to the circuit common. A pull-down delay resistor ($R_{PD}$) 42 is connected between the signal PD and the gate terminal (G) of NMOS pull-down device 34. A PMOS feedback device 38 is provided with the gate terminal (G) connected to the output terminal 16, and the drain terminal (D) connected to the gate terminal (G) of the NMOS pull-up device 34. A PMOS enable device 39 is provided with the source terminal (S) connected to $V_{DD}$, the gate terminal (G) connected to the active low !ENABLE input and the drain terminal (D) connected to the source terminal (S) of PMOS feedback device 38.

The operation of the drive stages 30-x and 31-x of FIG. 7, will now be discussed. When signal PU is high, the gate terminal (G) of PMOS pull-up device 32 will be driven high, thereby turning PMOS pull-up device 32 off. When signal PU is changed to a logic low level, the parasitic capacitance of the gate terminal (G) of PMOS pull-up device 32 combined with the parasitic capacitance of the drain (D) of the NMOS feedback device 36 will begin to discharge through pull-up delay resistor ($R_{PU}$) 40. This discharge time and consequently the turn-on delay for PMOS pull-up device 32 will be determined by the total parasitic capacitance and value of the pull-up delay resistor ($R_{PU}$) 40. This time can be tailored by adjusting both the value of the pull-up delay resistor ($R_{PU}$) 40 and the parasitic capacitances of the PMOS pull-up device 32 and the NMOS feedback device 36. Similarly, the parasitic capacitances of the gate terminal (G) of NMOS pull-down device 34 and the parasitic drain (D) capacitance of the PMOS feedback device 38 prevent gate terminal (G) of NMOS pull-down device 34 from changing instantaneously. When signal PD is low, the gate terminal (G) of NMOS pull-down device 34 will be driven low, thereby turning NMOS pull-down device 34 off. When signal PD is changed to a logic high level, the gate terminal (G) of NMOS pull-down device 34 will begin to charge through pull-down delay resistor ($R_{PD}$) 42. Like the pull-up drive stage 30, this charge time and consequently the turn-on delay for NMOS pull-down device 34 are determined by the parasitic capacitance and value of the pull-down delay resistor ($R_{PD}$) 42. This time can be set by adjusting both the value of pull-down delay resistor ($R_{PD}$) 42 and the parasitic drain capacitances of the PMOS feedback device 38 and the NMOS pull-down device 34. The NMOS enabling device 37 and PMOS enabling device 39 are off during the tri-state condition (ENABLE high and !ENABLE low). This prevents either PMOS pull-up device 32 or NMOS pull-down device 34 from being turned on via the output pin voltage and feedback devices 36 and 38 when tri-stated.

Typically, the sizing of the components within the n individual pull-up drive circuits 30 and m individual pull-down circuits 31 are not identical. Individual drive stages 30-$x$ and 31-$x$, respectively, have their components sized to drive a wide range of load capacitance 18 while maintaining a range of slew rate. The first drive stages 30-1 and 31-1 provide the initial drive currents and are sized for the smallest specified load capacitance 18 with approximately the maximum slew rate; these stages will have the shortest turn-on delay. The drive stages 30-2 or 31-2 are activated sometime after drive stages 30-1 or 31-1, respectively, to supply additional current to the load capacitance 18. The turn-on delay of drive stage 30-$x$ is shorter than the turn on delay for the next subsequent drive stage 30-($x$+1); similarly, the turn-on delay of drive stage 31-$x$ is shorter than the turn on delay for the next subsequent drive stage 31-($x$+1). As subsequent drive stages 30-3 through 30-$n$ or 31-3 through 31-$m$ are sequentially activated, the load current increases based upon the sizing of the pull-up or pull-down device, 32-$x$ and 34-$x$, respectively. Thus, the larger the load capacitance 18, the longer the charge or discharge time, and the more drive stages 30-$x$ or 31-$x$ that are turned on during the rise or fall of the output load voltage transition.

Referring now to FIGS. 6 and 7, the tailoring of the feedback mechanism is now discussed. Depending upon the drive circuit requirement, the feedback mechanism can provide either positive feedback to improve the turn on time of the individual drive device, or parasitic capacitance to slow the turn on time of the individual drive device.

Since the first stages 30-1 and 31-1 are sized for the smallest load currents, the feedback mechanism is sized to add parasitic capacitance on the gates of the PMOS pull-up device 32-1 and NMOS pull-down device 34-1. Specifically, the ratio of channel width to channel length of the NMOS enabling device 37-1 and PMOS enabling device 39-1 are small. When the ENABLE signal is high (!ENABLE low), the NMOS enabling device 37-1 and PMOS enabling device 39-1 will have a high source (S) to drain (D) resistance. The sizing of the NMOS feedback device 36-1 and PMOS feedback device 38-1 are such that the output voltage never reaches the threshold to turn them on. Thus, the NMOS feedback device 36-1 and PMOS feedback device 38-1 do not function as feedback devices, but instead add additional parasitic capacitance to the gate terminal (G) of the PMOS pull-up device 32-1 and NMOS pull-down device 34-1, respectively. This additional parasitic gate capacitance will increase the time for the gate terminal (G) to reach its turn on threshold and therefore slow the output transition time.

Subsequent stages 30-$x$ and 31-$x$ are sized for increasingly larger currents. Subsequent feedback mechanisms are sized to add less and less parasitic capacitance while increasing more and more the positive feedback from the output on the gates of the PMOS pull-up device 32-$x$ and NMOS pull-down device 34-$x$. The parasitic gate capacitance will increase the time for the gate terminal (G) to reach its turn on threshold and slow the output transition time while the positive feedback will speed up the output transition time. The ratio of channel width to channel length (W/L) of subsequent NMOS enabling device 37-$x$ and PMOS enabling device 39-$x$ are increasing (W/L-$x$< W/L-($x$+1)) so that when the ENABLE signal is high (!ENABLE low), the source (S) to drain (D) resistance ($R_{SD}$) of subsequent NMOS enabling devices 37-$x$ and PMOS enabling devices 39-$x$ will be smaller ($R_{SD}$-$x$>$R_{SD}$-($x$+1)). The sizing of the NMOS feedback device 36-$x$ and PMOS feedback device 38-$x$ are such that the output voltage reaches the threshold to turn them on sometime after the previous stages (30-($x$−1) or 31-($x$−1) ) turn on. Thus, the NMOS feedback device 36-$x$ and PMOS feedback device 38-$x$ add less and less parasitic capacitance and more and more positive feedback as $x$ increases.

Figure 8A:
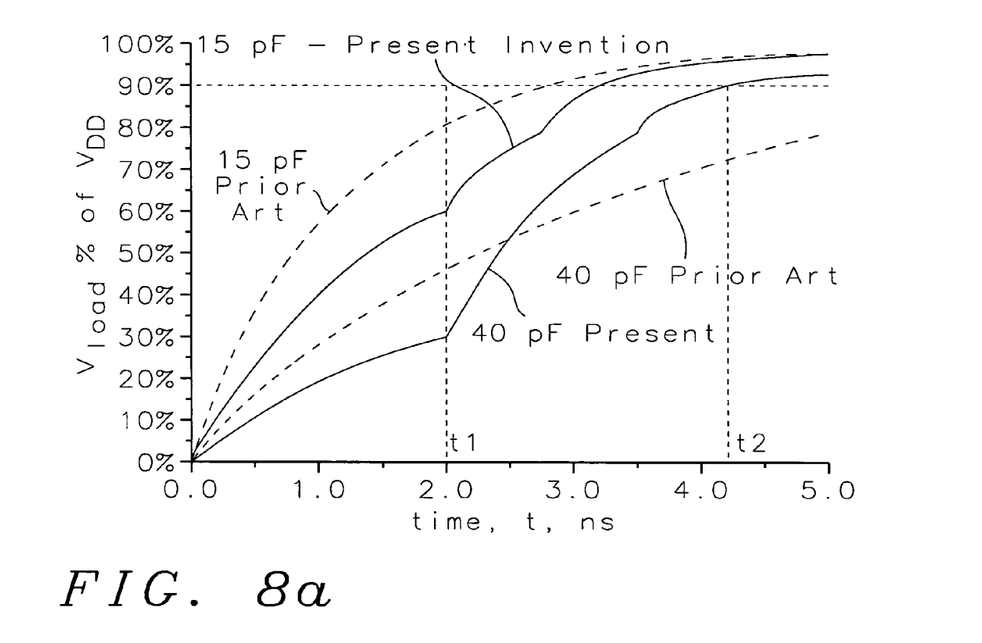
FIG. 8a illustrating the output buffer voltage rise waveform for the present invention compared against the prior art output buffer voltage rise waveform at both 15 pF and 40 pF load capacitances.

A typical load voltage rise curve for the present invention with two pull-up drive stages 30 is shown in FIG. 8a compared to the voltage rise curve for the prior art circuit. Times shown here are for illustration only and do not represent limitations of the present invention. When the load capacitance 18 is 15 pF, the load voltage rises quickly to $V_{DD}$; prior art circuits, using a single drive current, reach 90% of $V_{DD}$ in just under 3 ηs. At 40 pF, the prior art circuit does not reach 90% of $V_{DD}$ until well after 5 ηs. In this example, the present invention load drive current starts with a single drive stage 30-1 current less than that of the prior art circuit. At 2 ηs in this example, the second drive stage 30-2 is activated, thereby increasing the load current. When the output voltage (Vout) reaches a chosen level (approximately 78% of $V_{DD}$ in this example), the feedback mechanism in drive stage 30-2 is activated thereby bringing the output voltage more quickly to $V_{DD}$. In the present invention, with a 15 pF load capacitance 18, there is a slight increase of the voltage rise time over the prior art circuit. However, with a 40 pF load capacitance 18, the additional drive current causes the load voltage to rise faster and the output voltage reaches 90% of $V_{DD}$ at approximately 4.25 ηs.

Figure 8B:
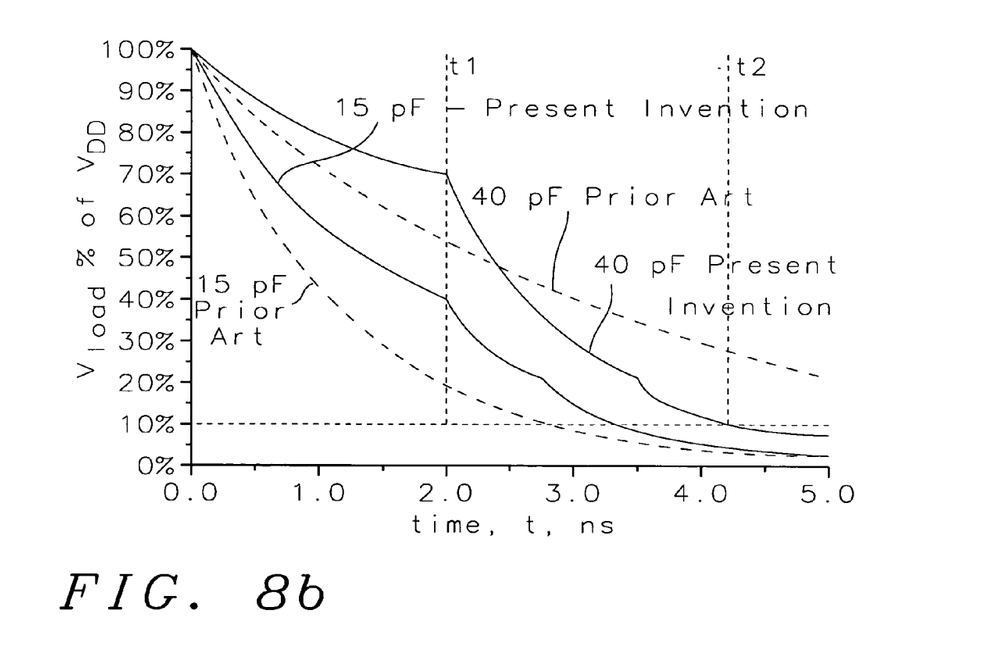
FIG. 8b illustrating the output buffer voltage fall waveform for the present invention compared against the prior art output buffer voltage fall waveform at both 15 pF and 40 pF load capacitances.

FIG. 8b shows a typical load voltage fall curve at 15 pF and 40 pF loads for the present invention using two pull down drive stages 31 and for prior art. Again, times depicted are for illustration only and do not represent limitations of the present invention. Prior art circuits, using a single drive current, reach 10% of $V_{DD}$ in just under 3 ηs when the load capacitance 18 is 15 pF. The prior art circuit with a 40 pF load capacitance 18, does not reach 10% of $V_{DD}$ until well after 5 ηs. In this example, the present invention load drive current starts with a single drive stage 31-1 current smaller than that of the prior art circuit. The second drive stage 31-2 is activated at 2 ηs, thereby increasing the load current.

When the output voltage (Vout) drops to a chosen level (approximately 22% of $V_{DD}$ in this example), the feedback mechanism in drive stage 31-2 is activated thereby bringing the output voltage more quickly to 0V. In the present invention there is a slight increase of the voltage fall time over the prior art circuit with a 15 pF load capacitance 18. However, the additional drive current causes the load voltage to fall faster and at approximately 4.25 ηs the output voltage reaches 10% of $V_{DD}$ with a 40 pF load capacitance 18.

Figure 9:
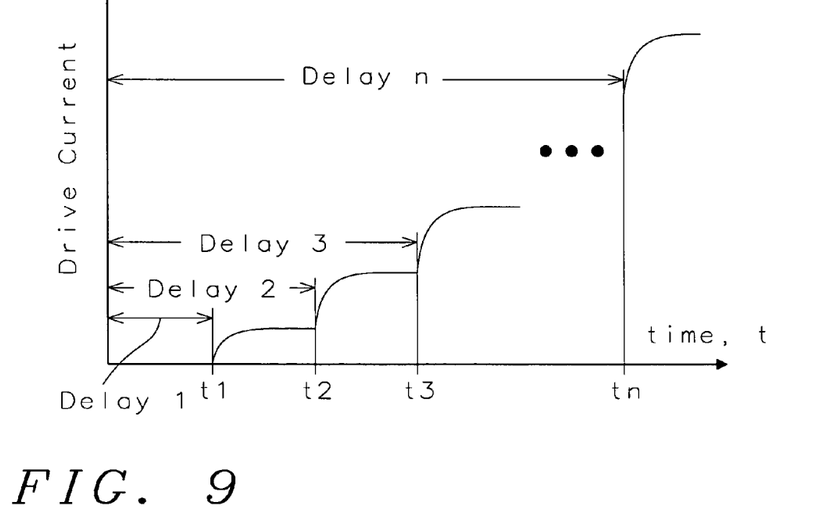
FIG. 9 illustrating in graphical form the required drive current for a desired slew rate using the present invention and the prior art buffer at both 15 pF and 40 pF load capacitances.

FIG. 9 summarizes the operation of the present invention with multiple drive stage 30-*n* and 31-*m*. The first drive stage (30-1 or 31-1) is activated after a delay ($t_1$). The current for this first drive stage is small and is sized to drive the minimum expected load capacitance. At time $t_2$, the second drive stage is activated and the load current increases. At time $t_3$, the third drive stage is activated and the load current increases further. Subsequent drive stages are activated after a delay further increasing the load current until the final stage is activated and final drive current achieved.

Figure 10:
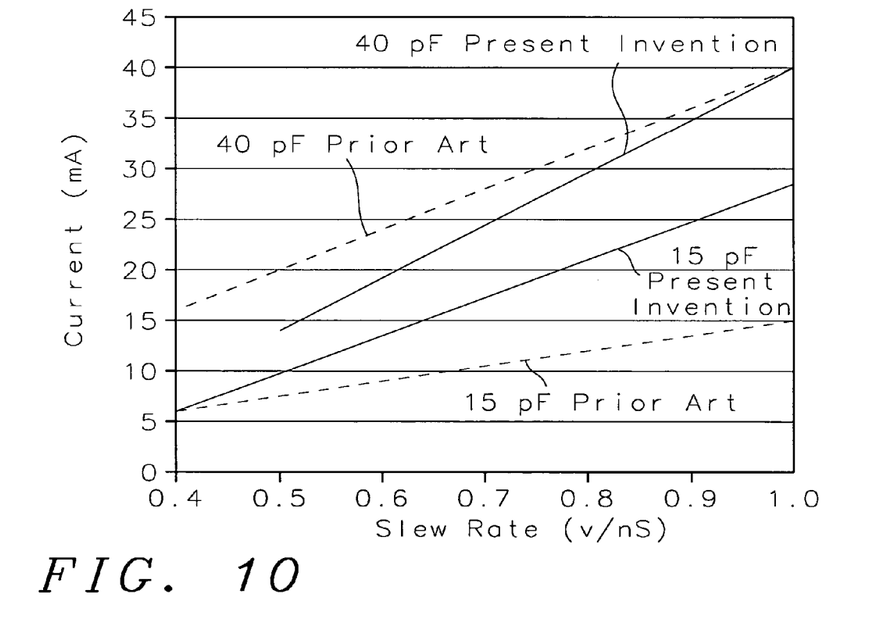
FIG. 10 illustrating in graphical form the drive current of the present invention at various times.

FIG. 10 illustrates the improvement of the invention over prior art. With a 15 pF load, the slew rate of the present invention is degraded slightly over prior art. At a load of 40 pF, however, there is an improvement of the slew rate. The slew rates at 15 pF and 40 pF are now closer together thus minimizing slew rate variation over changing loads The present invention divides the output buffer logic level transition into various time and current drive segments. A feedback path from the output back to the gate of each drive transistor is sized either to add parasitic capacitance to the gate of the drive transistor or to provide positive feedback. These techniques minimize differences in slew rate over the range of load capacitance and control the drive sequencing. During the first time segment, the smallest drive current is employed. After each subsequent delay, the drive current is increased and additional positive feedback employed. For smaller load capacitances, the final output voltage is reached quickly with the lower drive currents and only a slight degradation of settling time and slew rate. For larger load capacitances, the settling time and slew rate are dramatically improved by increasing the drive current. Thus, the settling time and slew rate for present invention have a smaller range than that of the prior art circuit.

While the invention has been particularly shown and described with reference to the preferred embodiments thereof, it will be understood by those skilled in the art that various changes in form and details may be made without departing from the spirit and scope of the invention.

What is claimed is:

1. A method of controlling the slew rate on the output terminal of an output buffer wherein the current delivered to said output terminal is varied during voltage transitions by dividing the output transition into various time and current drive segment in following steps:

sequentially turning on a plurality of n first conducting devices when said voltage transition of said output terminal is from a first voltage level to a second voltage level thereby connecting said output terminal to a first fixed voltage potential, wherein said sequentially turning on said plurality of n first conducting devices is accomplished by turning on of each of said first conducting devices after a delay such that the first of said plurality of first conducting devices has the shortest said delay and subsequent conducting devices have subsequently longer said delays, wherein the time duration of said delay is controlled by a network comprising resistance and capacitance and wherein said capacitance is comprised of the combination of parasitic capacitance of said first conducting device and a first feedback device; and sequentially turning on a plurality of m second conducting devices when said voltage transition of said output terminal is from said second voltage level to said first voltage level thereby connecting said output terminal to a second fixed voltage potential wherein said second fixed voltage potential is less than said first fixed potential.

2. The method according to claim 1 wherein said first conducting devices are PMOS transistors.

3. The method according to claim 1 wherein said second conducting devices are NMOS transistors.

4. The method according to claim 1 wherein said first feedback device is an NMOS transistor.

5. The method according to claim 1 wherein said sequentially turning on said plurality of m second conducting devices is accomplished by turning on of each of said second conducting devices after a delay such that the first of said plurality of second conducting devices has the shortest said delay and subsequent conducting devices have subsequently longer said delays.

6. The method according to claim 5 wherein the time duration of said delay is controlled by a network comprising resistance and capacitance.

7. The method according to claim 6 wherein said capacitance is comprised of the combination of parasitic capacitance of said second conducting device and a second feedback device.

8. The method according to claim 7 wherein said second feedback device is a PMOS transistor.

9. A device for controlling the slew rate on the output terminal of an output buffer wherein the rising transition of the voltage on said output terminal is achieved by sequentially activating a plurality of n distinct pull-up current driver stages each comprised of:

a pull-up signal input terminal;

a pull-up device which when activated will electrically connect said output terminal to a first fixed voltage potential;

a pull-up delay circuit which, when an activating signal is presented to said pull-up signal input terminal, will activate said pull-up device after a pull-up time delay;

a pull-up feedback device which when activated will feedback a portion of the signal on said output terminal to the input of said pull-up device;

a pull-up enabling device which when activated with an enable signal will activate said pull-up feedback device;

and wherein the falling transition of said voltage on said output terminal is achieved by sequentially activating a plurality of m distinct pull-down current driver stages each comprised of:

a pull-down signal input terminal;

a pull-down device which when activated will electrically connect said output terminal to a second fixed voltage potential;

a pull-down delay circuit which, when an activating signal is presented to said pull-down signal input terminal, will activate said pull-down device after a pull-down time delay;

a pull-down feedback device which when activated will feedback a portion of said signal on said output terminal to the input of said pull-down device; and a pull-down enabling device which when activated with an enable signal will activate said pull-down feedback device.

10. The device according to claim 9 wherein said pull-up device is a PMOS transistor.

11. The device according to claim 9 wherein said pull-down device is an NMOS transistor.

12. The device according to claim 9 wherein said pull-up delay device is comprised of a resistance and capacitance and wherein the duration of said pull-up time delay is controlled by selecting the values of said resistance and said capacitance.

13. The device according to claim 12 wherein said capacitance is comprised of the combination of parasitic capacitance of said pull-up device and said pull-up feedback device.

14. The device according to claim 9 wherein said pull-down delay device is comprised of a resistance and capacitance and wherein the duration of said pull-down time delay is controlled by selecting the values of said resistance and said capacitance.

15. The device according to claim 14 wherein said capacitance is comprised of the combination of parasitic capacitance of said pull-down device and said pull-down feedback device.

16. The device according to claim 9 wherein said pull-up feedback device is an NMOS transistor.

17. The device according to claim 9 wherein said pull-down feedback device a PMOS transistor.

18. The device according to claim 9 wherein said pull-up enabling device is an NMOS transistor.

19. The device according to claim 9 wherein said pull-down enabling device a PMOS transistor.

20. A device for controlling the slew rate on the output terminal of an output buffer wherein the rising transition of the voltage on said output terminal is achieved by sequentially activating a plurality of n distinct pull-up current driver stages each comprised of:
 a pull-up signal input terminal;
 a PMOS transistor which when activated will electrically connect said output terminal to a first fixed voltage potential;
 a pull-up delay circuit which, when an activating signal is presented to said pull-up signal input terminal, will activate said PMOS transitor after a pull-up time delay;
 a pull-up feedback device which when activated will feedback a portion of the signal on said output terminal to the gate of said PMOS transitor; and
 a pull-up enabling device which when activated with an enable signal will activate said pull-up feedback device;
 wherein the falling transition of said voltage on said output terminal is achieved by
sequentially activating a plurality of m distinct pull-down current driver stages each comprised of:
 a pull-down signal input terminal;
 an NMOS transistor which when activated will electrically connect said output terminal to a second fixed voltage potential;
 a pull-down delay circuit which, when an activating signal is presented to said pull-down signal input terminal, will activate said NMOS transistor after a pull-down time delay;
 a pull-down feedback device which when activated will feedback a portion of said signal on said output terminal to the gate of said NMOS transistor; and
 a pull-down enabling device which when activated with an enable signal will activate said pull-down feedback device.

21. The device according to claim 20 wherein said pull-up delay device is comprised of a resistance and capacitance and wherein the duration of said pull-up time delay is controlled by selecting the values of said resistance and said capacitance.

22. The device according to claim 21 wherein said capacitance is comprised of the combination of parasitic capacitance of said PMOS transistor and said pull-up feedback device.

23. The device according to claim 20 wherein said pull-down delay device is comprised of a resistance and capacitance and wherein the duration of said pull-down time delay is controlled by selecting the values of said resistance and said capacitance.

24. The device according to claim 23 wherein said capacitance is comprised of the combination of parasitic capacitance of said NMOS transistor and said pull-down feedback device.

25. The device according to claim 20 wherein said pull-up feedback device is an NMOS transistor.

26. The device according to claim 20 wherein said pull-down feedback device a PMOS transistor.

27. The device according to claim 20 wherein said pull-up enabling device is an NMOS transistor.

28. The device according to claim 20 wherein said pull-down enabling device a PMOS transistor.

* * * * *